United States Patent [19]

Shikata et al.

[11] Patent Number: 5,521,332

[45] Date of Patent: May 28, 1996

[54] HIGH DIELECTRIC LAYER-CONTAINING ALUMINA-BASED WIRING SUBSTRATE AND PACKAGE FOR SEMICONDUCTOR DEVICE

[75] Inventors: Kunihide Shikata; Takeshi Kubota; Akira Furusawa, all of Kokubu, Japan

[73] Assignee: Kyocera Corporation, Kyoto, Japan

[21] Appl. No.: 480,944

[22] Filed: Jun. 7, 1995

Related U.S. Application Data

[63] Continuation of Ser. No. 385,747, Feb. 8, 1995, abandoned, which is a continuation of Ser. No. 114,482, Aug. 31, 1993, abandoned.

[30] Foreign Application Priority Data

| Aug. 31, 1992 | [JP] | Japan | 4-230993 |
| Aug. 31, 1992 | [JP] | Japan | 4-230994 |
| Jul. 12, 1993 | [JP] | Japan | 5-171844 |

[51] Int. Cl.⁶ .................................................. H01L 23/02
[52] U.S. Cl. .......................................... 174/52.4; 257/700
[58] Field of Search .................................. 174/52.1, 52.3, 174/52.4; 257/678, 692, 698, 700, 701, 703, 771; 501/53, 54, 55, 73, 78

[56] References Cited

U.S. PATENT DOCUMENTS

| 3,235,939 | 2/1966 | Rodriguez et al. | 29/25.42 |
| 3,760,244 | 9/1973 | McClelland, Jr. | 317/258 |
| 4,027,209 | 5/1977 | Maher | 361/321.4 |
| 4,628,404 | 12/1986 | Yokoe et al. | 361/321 |
| 4,816,323 | 3/1989 | Inoue | 428/208 |
| 4,829,029 | 5/1989 | Kawahara et al. | 501/108 |
| 4,877,555 | 10/1989 | Yuhaku et al. | 252/512 |
| 4,959,330 | 9/1990 | Donahue et al. | 501/8 |
| 4,970,577 | 11/1990 | Ogihara et al. | 257/698 |
| 5,011,803 | 4/1991 | Park et al. | 501/136 |
| 5,099,388 | 3/1992 | Ogawa et al. | 361/321.2 |

FOREIGN PATENT DOCUMENTS

| 45722  | 11/1977 | Japan | C04B 35/10 |
| 50460  | 3/1982  | Japan | H01L 27/01 |
| 111396 | 7/1983  | Japan | H05K 3/46  |
| 229711 | 10/1987 | Japan | H01B 3/12  |
| 182252 | 7/1988  | Japan | C04B 35/10 |
| 119557 | 5/1989  | Japan | C04B 35/10 |

*Primary Examiner*—Kristine L. Kincaid
*Assistant Examiner*—Christopher Horgan
*Attorney, Agent, or Firm*—Loeb & Loeb

[57] ABSTRACT

A package for a semiconductor device comprising (i) a high dielectric layer composed of an alumina particles, a high permittivity-imparting agent in particles selected from (a) W or Mo, (b) Re and (c) zirconia and a glass phase comprising alumina and at least one component selected from silica, alkaline earth metal components, and rare earth device components present in their grain boundaries, (ii) a pair of electrode layers comprising as a main component a metal selected from W and Mo provided on both sides of the high dielectric layer, and (iii) insulation layers composed of alumina particles and a glass phase composed of alumina and at least one component selected from silica, alkaline earth metal components and rare earth device components, the insulation layers being provided so as to sandwich the electrode layers and the dielectric layer.

10 Claims, 7 Drawing Sheets

HIGH DIELECTRIC LAYER-CONTAINING ALUMINA-BASED WIRING SUBSTRATE AND PACKAGE FOR SEMICONDUCTOR DEVICE

This is a continuation of application Ser. No. 385,747 filed Feb. 8, 1995, now abandoned, which is itself a continuation of application Ser. No. 08/114,482 filed on Aug. 31, 1993 and now abandoned.

BACKGROUND OF THE INVENTION

1. Field of the Invention

This invention relates to an alumina-based wiring substrate having a high dielectric layer in its inside and a package for semiconductor device, and more specifically, to a wiring substrate and a package having stable electric properties, excellent sealing performacne, and mechanical strength.

2. Description of the Prior Art

Heretofore, for Example, in a package for semiconductor device, semiconductor ICs (integrated circuits) are liable to make an erroneous action by foreign noises or unwanted irradiation. By building-in a ceramic capacitor having a capacity of about 30 to 100 uF between a power supply side and a ground side, the noises are absorbed to prevent the erroneous action. Since the connection of this capacitor was heretofore separately performed outside of the package, the density of wiring or the operation speed of IC cannot be increased.

From this viewpoint, a package containing a capacitor built in was recently developed (for example, see Japanese Laid-Open Patent Publication No. 160461/87). On the other hand, since alumina used as a substrate material heretofore is an insulator and a dielectric, it may be used as a dielectric, and a capacitor may be built in a package.

However, such an alumina has a low permittivity of about 0.5 to 10. Accordingly, when a dielectric is formed from alumina itself, it was necessary to form a plurality of dielectric layers interposed with electrodes and to increase the area of the dielectric. For this reason, the package or substrate becomes large in size, and the cost of the product increases.

Furthermore, for example disclosed in Japanese Laid-Open Patent Publication 87091/1991, which corresponds to U.S. Pat. No. 5,099,388, issued Mar. 24, 1992, a multi-layer alumina-based wiring substrate is known in which a high dielectric layer containing a high permittivity-imparting agent composed of W or Mo in the alumina is interposed between insulation layer containing alumina as a main component and a pair of electrode layers composed of a paste of a high-melting metal such as W or Mo as a main component coated or printed are formed on both sides of the high dielectric layer.

However, the known high dielectric layer-containing wiring substrates or packages for semiconductor device are still unstable in electric properties, and an insulation resistance between electrodes is decreased. In extreme cases, there is a fear that the electrodes are likely to be shorted. Package has insufficient sealability (air-tightness). Moisture may permeate to change the surface resistance of the electrode layers. There is also a defect that a sufficient adhesion strength cannot be obtained between the electrode layer and the high dielectric layer or the insulation layer.

SUMMARY OF THE INVENTION

Accordingly, it is an object of this invention to provide an alumina-based wiring substrate and a package dor semiconductor device containing a high dielectric layer in its inside and having stable electric properties, excellent sealability, and mechanical strength.

Another object of this invention is to provide alumina-based wiring substrate containing a high dielectric layer and a package for semiconductor device, in which excellent air-tightness and sealability and interlayer adhesion strength are obtained between the electrode layer and the high dielectric layer or the insulation layer and the diffusion and transfer of materials constituting the electrode layer to the high dielectric layer is suppressed.

The alumina-based wiring substrate containing a high dielectric layer, or the package for semiconductor device in accordance with this invention is a laminate composed of (i) a high dielectric layer consisting of alumina particles, a high permittivity imparting agent in particles selected from the group consisting of (a) W or Mo, (b) Re and (c) zirconia and a glass phase consisting of alumina, and at least one component selected from silica, alkaline earth metal component and rare-earth device components present in the grain boundaries of these, (ii) a pair of electrode layers of a metal selected from the group consisting of W and Mo provided on both sides of the high dielectric layer, and (iii) an insulation layer composed of alumina particles and a boundary grain glass phase composed of alumina, at least one component selected from the group consisting of silica, alkaline earth metal components, and rare earth device components, said layer being provided so as to sandwich the electrode layers and the high dielectric layer.

In the wiring substrate and package of this invention, a pair of electrode layers (ii) are formed on both sides of the high dielectric layer (i) to foam a kind of capacitor, and this capacitor is interposed between a pair of insulated layers (iii). The electrode layer (ii) is a known metallized layer, namely formed of W or Mo.

The high dielectric layer (i) is composed of alumina particles, a high permittivity-imparting agent in particles, and a glass phase existing in a grain boundary of these. The high permittivity-imparting agent serves to give a specific permittivity of at least 10.8, particularly a specific permittivity of 13 to 40 to the dielectric. In this invention, at least one component selected from (a) W or Mo, (b) Re and (c) zirconia are used.

The glass phase residing in the grain boundary is formed by reacting an alumina component from alumina particles with at least one component selected from silica, alkaline earth metal components and rare earth device components to be incorporated as a sintering aid.

If the high permittivity-imparting agent is $ZrO_2$, there is a possibility that $ZrO_2$ will be dissolved in a slight amount in the glass phase of the grain boundary. In this case, the chemical resistance of the high dielectric layer can be increased.

The insulation layer (iii) is composed of alumina particles and a glass phase present in the grain boundary thereof, and the composition and the forming process of the glass phase are the same as those mentioned above.

By forming the glass phase in the high dielectric layer (i) and the insulation layer (iii) existing on both sides of the electrode layer (ii), the adhesion of the electrode layer to these two layers is increased further and simultaneously the air-tightness and the interlayer adhesion strength of the package can be increased.

Thus, in the substrate or package of this invention, electric properties are stable, and the insulation resistance between electrodes is prevented from becoming decreased.

DETAILED DESCRIPTION OF PREFERRED EMBODIMENTS

The substrate and package in accordance with the present invention will be produced in the following manner.

Insulation Layer 88 to 96% by weight of an alumina powder having an average particle diameter of not more than 5 μm was mixed with 4 to 12% by weight of $SiO_2$, rare earth device oxides or alkaline earth metals (sintering aids) such as $Y_2O_3$ or MgO, if desired, together with 0.5 to 5% by weight of a coloring agent such as $Fe_2O_3$, $Cr_2O_3$, $MnO_2$, $TiO_2$, Mo or W. To the mixture was added a binder such as butyral or acrylic acid. A solvent such as toluene was added and mixed. Thereafter, the mixture was sheeted by a known method such as a doctor blade to form a sheet having a thickness of 0.2 to 1 mm.

A plurality of such green sheets were laminated to form a molded product of an insulation layer.

High Dielectric Layer

An alumina powder having a particle diameter of 5 μm was mixed with a high permittivity-imparting agent, $SiO_2$, alkaline earth metal components such as CaO and MgO and rare earth oxides such as $Y_2O_3$ (sintering aids). As required, coloring agents such as $Fe_2O_3$, $Cr_2O_3$, $MnO_2$, $TiO_2$, Mo or W were further admixed. A binder such as butyral and acrylic acid was added to the mixture, and a solvent such as toluene was mixed. The mixture was sheeted to a thickness of 20 to 60 μm to prepare a molded article of a high dielectric layer, The alumina content in the high dielectric layer may be present in an amount of 67 to 87% by weight in the group (a), namely W or Mo. In the case of group (b), namely Re, the alumina content may preferably be 40 to 95% by weight. In the case of group (c) namely $ZrO_2$ the alumina content may be 10 to 90% by weight.

If the alumina content is larger than the above-mentioned ranges, the permittivity becomes too low. On the other hand, if the alumina content is smaller than each of the above ranges, the insulation property will be decreased.

The high permittivity-imparting agent differs somewhat in its amount depending upon its type. If it is W or Mo, its amount is 5 to 30% by weight. It may preferably be present in an amount of 5 to 60% by weight if it is Re, and in an amount of 10 to 90% by weight if it is $ZrO_2$. If the amount of the high permittivity-imparting agent is less than the above ranges, the permittivity will be decreased. If it is larger than the above ranges, the insulation property will be decreased.

On the other hand, the amount of the sintering aid (glass-forming component) may preferably be at least 3% by weight. If it is smaller than the above range, the adhesion between the high dielectric layer (or the insulation layer) and the electrode layer, the air-tightness and the adhesion strength are unpreferably decreased.

When W or Mo is used as the high permittivity-imparting agent, the ratio of $Al_2O_3$ to W or Mo should preferably be 87:10 to 67:30. When the electrode is W or Mo, the high permittivity-imparting agent may consist if the same W (or Mo). Furthermore, when the electrode is composed of W (or Mo), the high permittivity-imparting agent may be composed of a different material from Mo (or W). In the latter case, the thickness of the high dielectric layer may be adjusted to at least 30 μm.

If the high permittivity-imparting agent and the electrode layer are formed from the same material, the solid dissolving of W or Mo does not occur. Diffusion of the high-melting metal W or Mo existing in the electrode layer into the high dielectric layer is suppressed. The decrease of the insulation resistance of the high dielectric layer between electrodes can be prevented. If the high permittivity-imparting agent differs from the electrode layers, the electrode-forming material W or Mo diffuses in the high dielectric layer. But by adjusting the thickness of the high dielectric layer to at least 30 μm, the decrease in the insulation resistance between the electrode layers can be prevented.

When Re is used as the high permittivity-imparting agent, alumina and Re may preferably be used in a weight ratio of 95:5 to 60:40.

Re may be used in the form of metallic Re or $Re_2O_3$ or metallic Re and $Re_2O_3$ may be added together.

When zirconia is used as the high permittivity-imparting agent, alumina and zirconia may preferably be used in a weight ratio of 90:10 to 10:90, especially 70:30 to 30:70. The zirconia may contain 5 to 15 mole % of a rare earth oxide based on the entire amount of $ZrO_2$.

If the amount of $ZrO_2$ is larger than the above amount, a thermal expansion difference between the insulation layer and the dielectric layer becomes large, and a good laminate tends to be not formed.

The rare earth oxide is included in an amount of 5 to 15 mole % based on the entire amount of $ZrO_2$ because if the rare earth oxide is less than 5 mole %, a phase transition from a tetragonal system to a monoclinic system occurs and inconveniences such as cracking are developed. If the amount is larger than 15 mole %, the permittivity of $ZrO_2$ itself decreases, and the effect of increasing high permittivity of the dielectric layer will be decreased. The rare earth oxides are preferably represented by $RE_2O_3$ (wherein RE is a rare earth device) such as $Y_2O_3$, $Nd_2O_3$, $La_2O_3$, and $Sm_2O_3$.

$ZrO_2$ in this embodiment of the invention may be stabilized $ZrO_2$ obtained by dissolving 5 to 15 mole % of the rare earth device oxide in $ZrO_2$. The crystal phase of $ZrO_3$ in this invention may be partially stabilized $ZrO_2$ in which a tetragonal system and a cubic system are mixedly present, and completely stabilized $ZrO_2$ in which only the cubic system is present. Furthermore, a monoclinic system $ZrO_2$ may be mixedly present. The crystal particle size of $Al_2O_3$ is 3 to 20 μm, and desirably the crystal particle size of $ZrO_2$ is 1.5 to 10 μm.

Stabilized or partially stabilized $ZrO_2$ need not to be used as a starting powder. At the time of prescription, rare earth device compounds necessary for stabilizing $ZrO_2$ are added, and at the time of calcination, zirconia may be stabilized completely and partially.

In this embodiment of the invention, at least one component selected from Mo, W and Re is included. Mo is contained in an mount of 5 to 30% by weight based on the entire weight. W is contained in an amount of 5 to 50% by weight based on the entire weight. Re is desirably contained in an amount of 10 to 60% by weight based on the entire weight. If Mo is included in an amount of more than 30% by weight, or W is included in an amount of more than 50% by weight, or Re is included in an amount of more than 60% by weight, the insulation resistance was abruptly decreased.

The sintering aid used in this invention may desirably contain $SiO_2$, a rare earth device oxide component such as $Y_2O_3$ and an alkaline earth metal oxide. The total amount of $SiO_2$ and the rare earth device oxide is contained in a weight ratio of 3:1 to 5:1 to the alkaline earth metal oxide. The product having this composition has excellent characteristics mentioned above.

A through-hole is formed in the high dielectric layer molded article and the insulation layer molded article, and a high-melting metal paste such as W or Mo is filled. Thereafter, an electrode layer paste containing 90 to 100% by weight of W or Mo, and if desired, containing 0 to 10% by weight of $Al_2O_3$, $Si_2$, an alkaline earth metal, a rare earth metal and its compounds is coated on the upper and lower surfaces of the high dielectric layer molded article.

The high dielectric layer molded article which has been coated on the electrode paste is interposed between the insulation layer molded article, and pressed under a predetermined pressure to press-bond them. Thereafter, the press-bonded product is sintered usually for 1 to 2 hours in a moistened nitrogen-hydrogen gaseous mixture (reducing atmosphere) at 1400° to 1700° C. to obtain a multilayer alumina-based wiring substrate or a package for semiconductor device in which the dielectric layer and the electrode layers are interposed between the insulation layers.

The high dielectric layer molded article may be constructed by forming a plurality of the above sheets and alternately laminating these sheets and the electrode layers made of a high-melting metal such as W or Mo. In such a case, an electrostatic capacitance can be increased.

The multilayer alumina-based wiring substrate of this invention of the invention will be explained with reference to the accompanying drawings.

EXAMPLE 1

Figure 1:
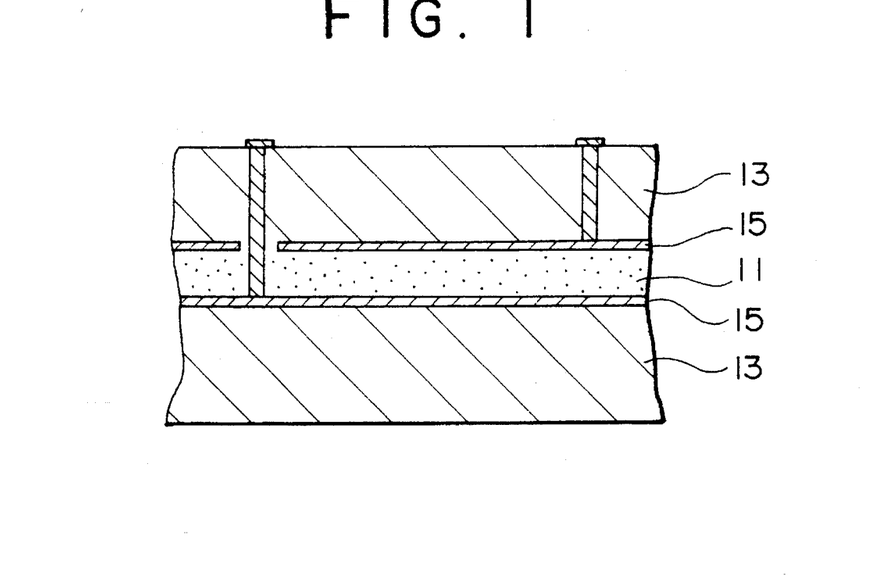
FIG. 1 is a vertical sectional view showing the multilayer alumina-based wiring substrate of this invention.

FIG. 1 shows a vertical sectional view of the multilayer alumina-based wiring substrate of the present invention. In the drawing, the multilayer alumina-based wiring substrate is constructed of a high dielectric layer 11 and an insulation layer 13 laminated to interpose the high dielectric layer 11. An electrode layer 15 is formed between the upper and lower surfaces of the high dielectric layer 11 and the insulation layer 13.

The high dielectric layer 11 is obtained by first preparing the high dielectric layer molded article.

As starting powders, 82% by weight of an alumina powder having an average particle size of 3 μm was mixed with 8% by weight in total of 6% $SiO_2$, 1% CaO and 1% MgO, and 10% by weight of a high permittivity-imparting agent composed of W and Mo. To the mixture, a binder composed of butyral was added. Toluene and isopropyl alcohol were further added in a weight ratio of 80:20, and the mixture was sheeted by a doctor blade method to obtain a high dielectric layer molded article.

On the other hand, the insulation layer molded article was mixed with 92% by weight of an alumina powder having an average particle size of 3 μm, 8% by weight of 6% $SiO_2$, 1% CaO and 1% MgO (sintering aids), a binder composed of butyral, toluene and isopropyl alcohol. The mixture was sheeted by a doctor blade method to form an insulation layer molded article. A through-hole was formed in the high dielectric layer molded article and the insulation layer molded article, and a high-melting metallic paste such as W or Mo was filled.

Thereafter, an electrode paste containing 98% on the upper and lower surfaces of the high dielectric layer molded article.

Thereafter, an electrode paste containing 98% by weight of W or Mo the same material as the high permittivity-imparting agent of the high dielectric layer molded article and 2% by weight of alumina as a main component was applied to the upper and low surfaces of the high dielectric layer molded article by screen printing to form an electrode layer.

The high dielectric layer molded article coated with the electrode layer paste was interposed between the insulation layer molded articles. Thereafter, the entire product was sintered commonly for 2 hours at 1550° C. in a moistened nitrogen-hydrogen gaseous mixture (reducing atmosphere) to obtain a multilayer alumina-based wiring substrate of the invention.

To ascertain the effect of the present invention, a leak current between the electrode layers and an electrostatic capacitance were measured by changing the type or amount of the high permittivity-imparting agent of the high dielectric layer molded article and the material of the electrode layer.

TABLE 1

| Sample No. | Electrode layer (as a main component) | Amount (wt. %) of the high permittivity imparting agent in the high dielectric layer | Leak current (A) | Electrostatic capacitance (nF) |
| --- | --- | --- | --- | --- |
| 1 | W | W 10 | $2.3 \times 10^{-9}$ | 3.1 |
| 2 | W | W 20 | $2.7 \times 10^{-9}$ | 3.6 |
| 3 | W | W 30 | $3.3 \times 10^{-9}$ | 4.2 |

TABLE 1-continued

| Sample No. | Electrode layer (as a main component) | Amount (wt. %) of the high permittivity imparting agent in the high dielectric layer | Leak current (A) | Electrostatic capacitance (nF) |
| --- | --- | --- | --- | --- |
| 4 | Mo | Mo 10 | $2.8 \times 10^{-9}$ | 3.4 |
| 5 | Mo | Mo 15 | $3.4 \times 10^{-9}$ | 4.1 |
| 6 | Mo | Mo 20 | $5.9 \times 10^{-9}$ | 5.6 |

In the above Example, the shape of an electrode was made 25 mm×25 mm×6 μm, and the thickness of the high dielectric layer was adjusted to 25 μm. The electrostatic capacitance was measured by using a Q meter (Y, H, P 4342A) at 25° C. under a condition of 1 KHz and 1.0 V rm.

For comparison, the amounts of sintering aids were varied for forming a grain boundary such as $SiO_2$, CaO, MgO, and $Y_2O_3$. As a result, if the amounts of $SiO_2$, CaO, MgO, and $Y_2O_3$ are less than 3% by weight, electrode layers composed of W and Mo in appearance were not fully sintered. It was difficult to uniformly adhere and form. The air-tightness of the package measured by using a He leak director led to the confirmation that air-tightness decreased.

On the other hand, in the products of this Example, adhesion to the electrode layer was good, and by the above test, no leak was noted.

EXAMPLE 2

A different material from the high permittivity-imparting agent of the high dielectric layer molded article was used to produce the electric layers, and the high dielectric layer was adjusted to at least 30 μm. This Example was the same as Example 1 except that an electrode paste containing 98% by weight of a different material from the high permittivity-imparting agent of the high dielectric layer molded article and 2% by weight of an additive including alumina as a main component was used, and the high dielectric layer molded article was produced so that the high dielectric layer became at least 30 μm.

In order to confirm the effect of the invention, the present inventors measured the leak current between the electrode layers and the electrostatic capacitance by varying the type and amount of the high permitivity-imparting agent of the high dielectric layer molded article, the material of the electrode layer and the thickness of the high dielectric layer. The experimental results are shown in Table 2.

EXAMPLE 3

A package for semiconductor device was produced by using the same material as in Example 1 except that the laminating structure was changed as shown in FIG. 2 to FIG. 7.

Figure 2:
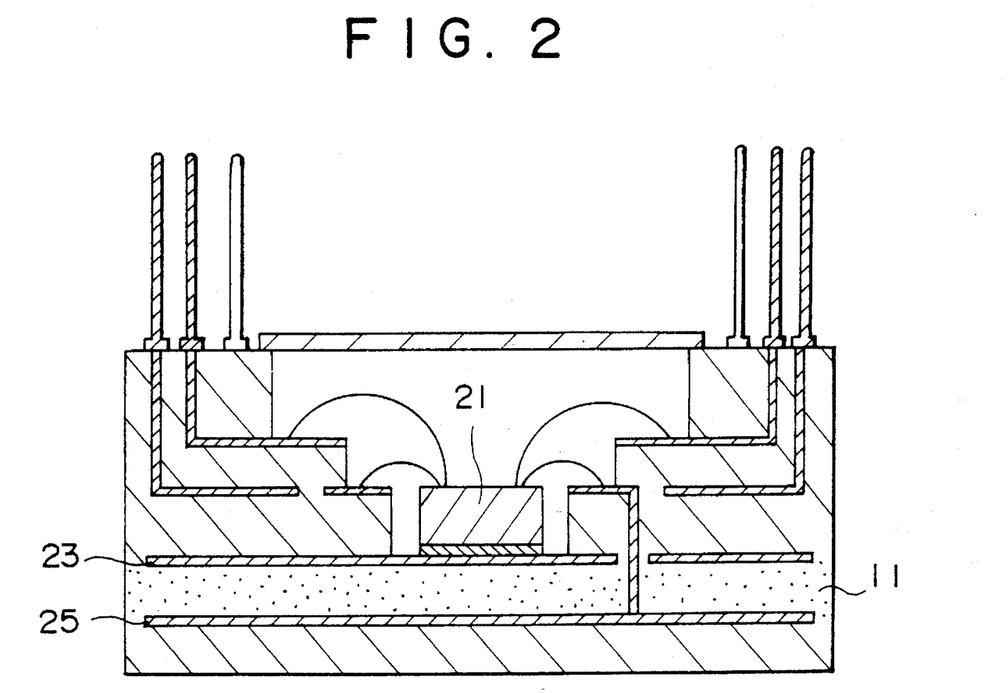
FIG. 2 is a vertical sectional view showing one example of the package for semiconductor device of the Pinglid array (PGA) type in accordance with this invention.

In the package of FIG. 2, the lower surface of a semiconductor device 21 is connected to an upper side electrode layer 23 by a conductor material and an underside electrode layer 25 is connected to the semiconductor device 21 by a through-hole.

Figure 3:
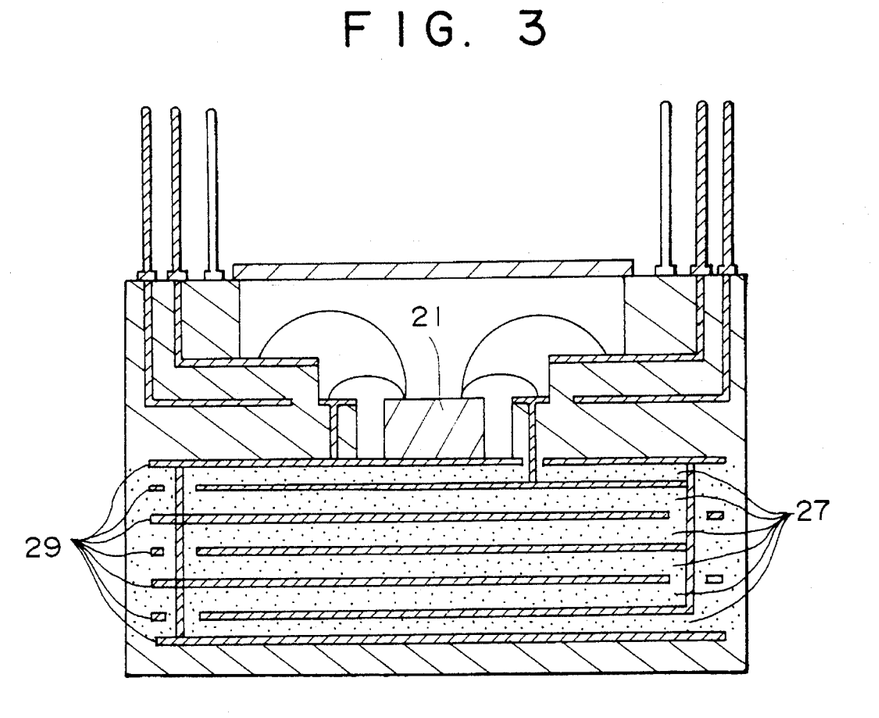
FIG. 3 is a vertical sectional view showing another type of example of the package for semiconductor device (PGA) in accordance with this invention.

In the package of FIG. 3, the high dielectric layer 27 and electrode layers 29 were alternately laminated below the semiconductor device 21. These electrode layers 29 were connected to the semiconductor device 21 by a through-hole.

Figure 4:
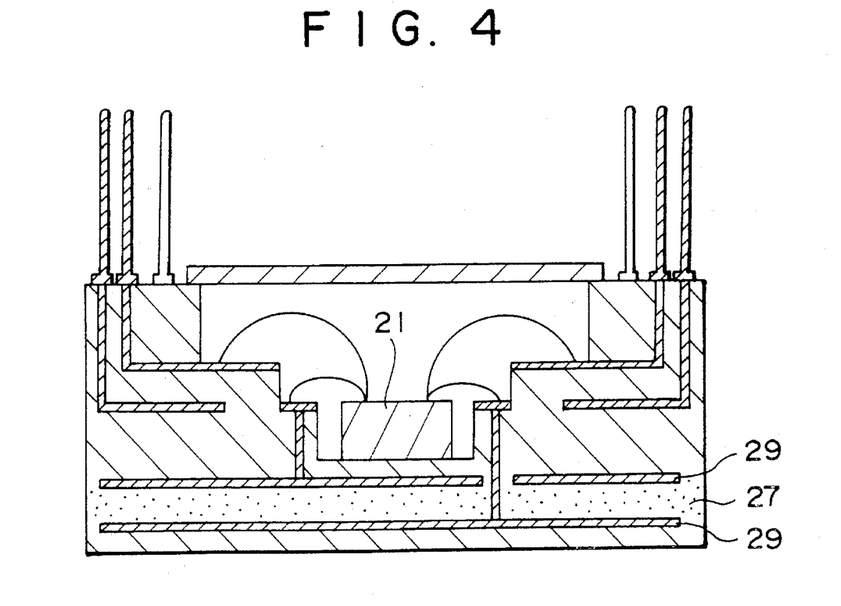
FIG. 4 is a vertical sectional view of still another example of the package for semiconductor device of the invention.

In the package of FIG. 4, the electrode layers 29 were formed upwardly and downwardly of the high dielectric layer 27 below the semiconductor device 21. These electrode layers 29 were connected to the semiconductor device 21 by a through-hole.

Figure 5:
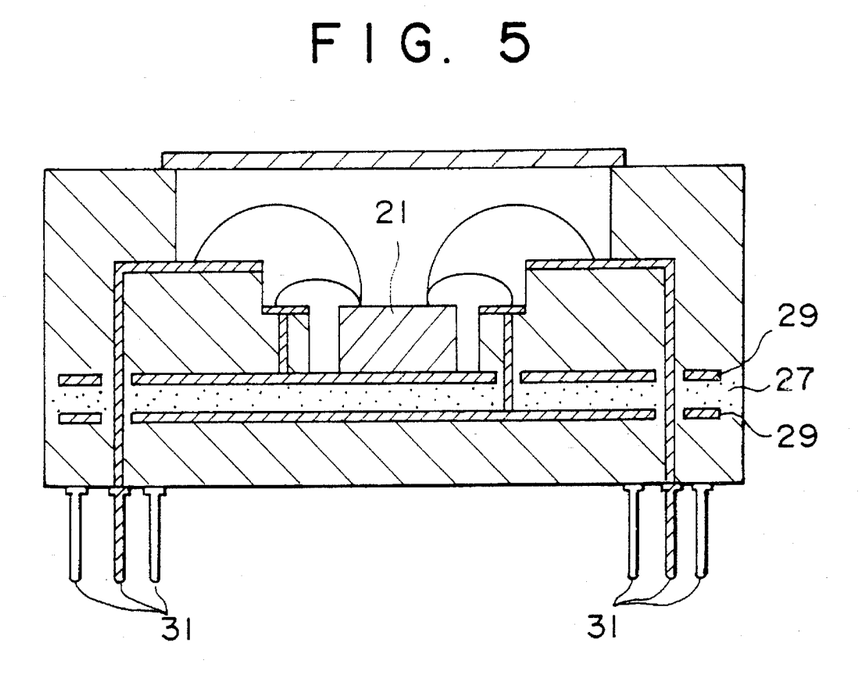
FIG. 5 is a vertical sectional view of still another example of the package for semiconductor device of the invention.

In the package of FIG. 5, the electrode layers 29 were formed upwardly and downwardly of the high dielectric layer 27 below the semiconductor device 21, and these electrode layers 29 are connected to the semiconductor device 21 by a through-hole. Furthermore, pins 31 are fixed to the under surface. A through-hole passing without contact with the electrode layers 29 is connected to these pins 31.

Figure 6:
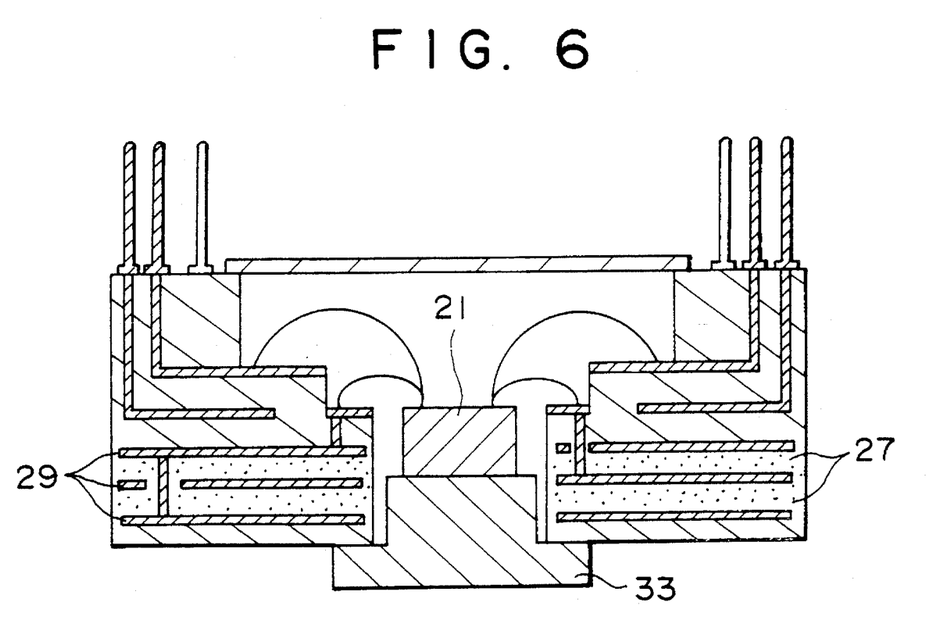
FIG. 6 is a vertical sectional view of still another example of the package for semiconductor device (PGA) of the invention.

In the package of FIG. 6, the high dielectric layers 27 and the electrode layers 29 were alternately laminated. These electrode layers 29 were connected to the semiconductor device 21 by a through-hole. Furthermore, the semiconductor device 21 is fixed to a heat sink 33.

Figure 7:
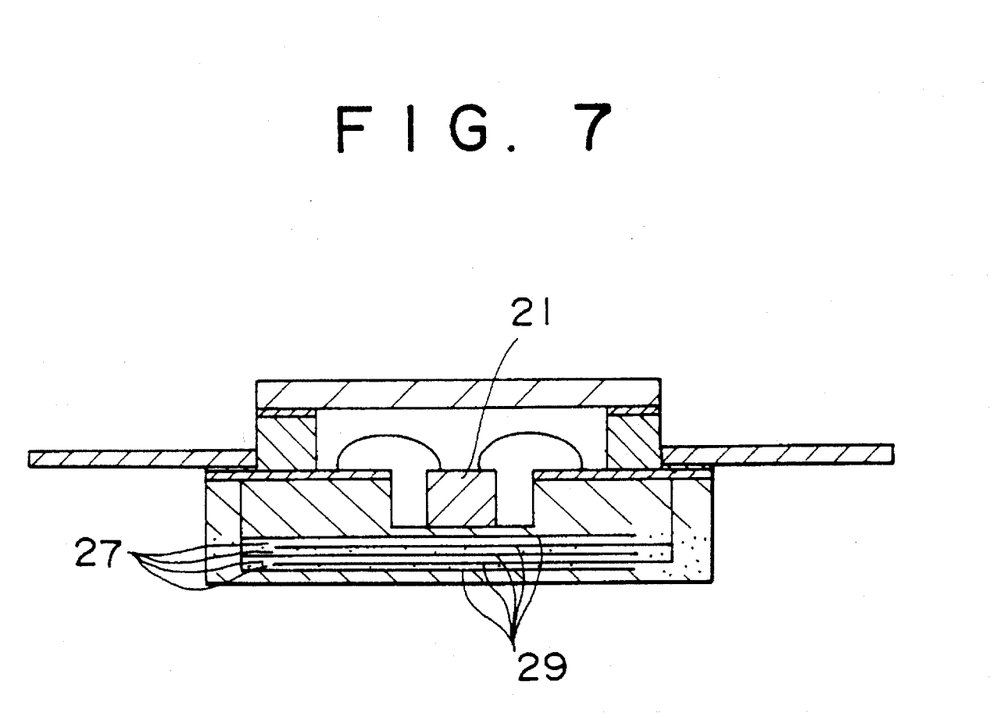
FIG. 7 is a vertical sectional view showing a further example of the package for semiconductor device of the flat type in accordance with this invention.

The package of FIG. 7 is a flat package. The high dielectric layers 27 and the electrode layers 29 are alternately laminated. These electrode layers were connected to the semiconductor device 21 by a through-hole.

TABLE 2

| Sample No. | Electrode layer (as a main component) | Amount (wt. %) of the high permittivity imparting agent in the high dielectric layer | Thickness of the dielectric layer (μm) | Leak current (A) | Electrostatic capacitance (nF) |
| --- | --- | --- | --- | --- | --- |
| 7 | W | Mo 15 | 30 | $5 \times 10^{-9}$ | 5.2 |
| 8 | W | Mo 15 | 40 | $3.3 \times 10^{-9}$ | 3.9 |
| 9 | W | Mo 15 | 50 | $2.1 \times 10^{-9}$ | 3.1 |
| 10 | Mo | W 20 | 30 | $4.0 \times 10^{-9}$ | 3.1 |
| 11 | Mo | W 20 | 40 | $2.4 \times 10^{-9}$ | 2.5 |
| 12 | Mo | W 20 | 50 | $1.7 \times 10^{-9}$ | 2.0 |

In Example 2, the shape of the electrode was set at 25 mm×25 mm×6 μm. Each sample was changed in the material W or Mo and the thickness of the high dielectric layer. Other conditions remain the same.

EXAMPLE 4

The wiring substrate shown in FIG. 1 was prepared by the method shown in FIG. 1.

As starting powders, 82% by weight of an alumina powder having an average particle size of 3 μm, and 8% by weight in total of 6.4% of $SiO_2$, 0.8% of CaO, and 0.8% of MgO as sintering aids and 10% by weight of an Re metal powder were added and fully dispersed and mixed. A binder composed of butyral was added to the mixture, and toluene and alcohol was further mixed. The mixture was sheeted by a doctor blade method to form a high dielectric molded article.

On the other hand, 92% by weight of an alumina powder having an average particle size of 3 μm, 8% by weight in total of 6.4% of SiO, 0.8% of CaO, and 0.8% of MgO as sintering aids, a binder composed of butyral, and toluene and alcohol were added and mixed. The mixture was sheeted by a doctor blade method to form insulation layer molded articles. Through-holes were prepared in the insulation layer molded articles and the high dielectric layer molded article, and a high-melting metal paste such as W and Mo was filled.

An electrode paste containing at least one of metal Re, Mo and W and 1 to 10% based on the above metal of an additive containing alumina as a main component was applied to the upper and lower surfaces of the high dielectric layer molded article by screen printing to form an electrode layer having a thickness of about 8 μm.

The high dielectric layer molded article coated with the electrode layer paste was interposed between the insulation layer molded articles. The entire product was then commonly sintered in a moistened nitrogen-hydrogen gaseous mixture (reducing gas) at 1550° C. for 2 hours to obtain a multilayer alumina-based wiring substrate in accordance with this invention.

Figure 8:
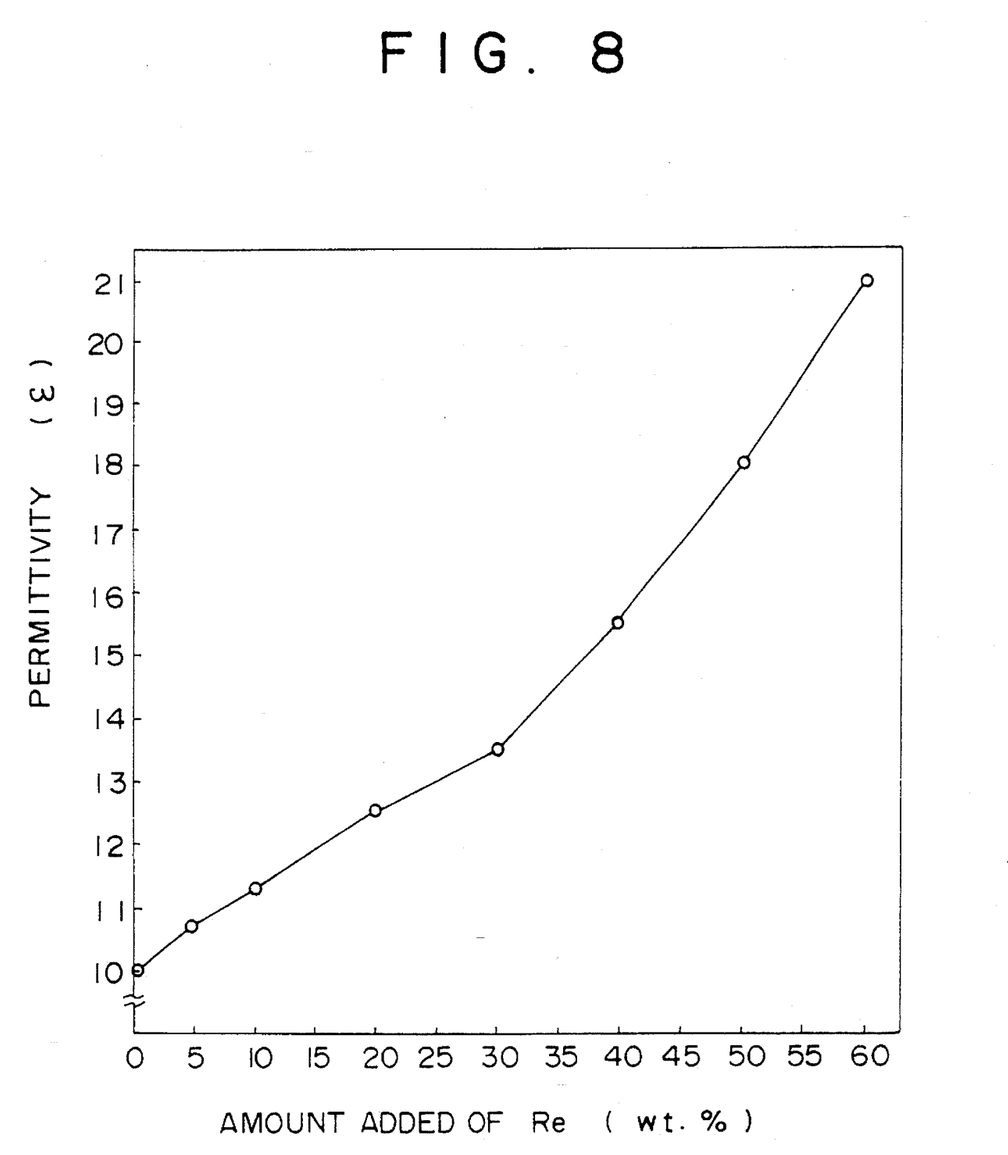
FIG. 8 is a graph showing variations in permittivity when the amount incorporated of Re in the high dielectric layer is varied.

In order to confirm the effect of this invention, the present inventors measured the change of the permittivity of the high dielectric layer by changing the amount of Re of the high dielectric layer. The experimental results are shown in the graph of FIG. 8.

In the above Example, the shape of the electrode was adjusted to a dimension of 25 mm×25 mm×6 μm, and the thickness of the high dielectric layer was made 25 μm. On both sides of this dielectric layer, electrode layers composed of metal Re having a thickness of 5 μm were formed. The measurement was performed by using a Q meter (Y, H, P 4342A) to measure an electrostatic capacitance at 25° C. under a condition of 1 KHz and 1.0 Vrsm. From this electrostatic capacitance, a permittivity at 25° C. was calculated.

From this graph, it is seen that as the amount of Re in alumina was increased, the permittivity became high. When an experiment was performed in which Re was added in a larger amount than 60% by weight, the insulation resistance was decreased, and the permittivity could not be measured.

EXAMPLE 5

The wiring substrate shown in FIG. 1 was produced by the following method.

As starting powders, 48% by weight of an alumina powder having an average particle size of 3 μm, 4% by weight in total of 3.0% of $SiO_2$, 0.5% of CaO, and 0.5% of MgO as sintering aids, and 48% by weight of partially stabilized $ZrO_2$ ($8Y-ZrO_2$) stabilized with 8 mole % of $Y_2O_3$ based on the entire amount of $ZrO_2$ were fully dispersed and mixed. A binder composed of butyral was added, and toluene and alcohol were mixed. The mixture was sheeted by a doctor blade method to obtain a high dielectric layer molded article.

On the other hand, 92% by weight of an alumina powder having an average particle size of 3 μm, 8% by weight in total of 3.3% of $Y_2O_3$, 3.3% of $SiO_2$, 0.7% of CaO and 0.7% of MgO as sintering aids, a binder composed of butyral, and toluene and alcohol were added and mixed. The mixture was sheeted by a doctor blade method to form insulation layer molded article. Through-holes were prepared in the insulation layer molded articles and the high dielectric layer molded article, and a high-melting metal paste such as W or Mo was filled.

Thereafter, an electrode layer paste containing one metal of metallic Re, Mo and W and 1 to 10% by weight based on the metal of an additive having alumina as a main component was applied to the upper and lower surfaces of the high dielectric layer molded article by screen printing to form an electrode layer having a thickness of about 8 μm.

The high dielectric layer molded article coated with the electrode paste was interposed between the insulation layer molded articles. Thereafter, the entire product was commonly sintered for 2 hours at 1600° C. in a moistened nitrogen-hydrogen gaseous mixture (reducing atmosphere) to obtain a multilayer alumina-based wiring substrate in accordance with this invention.

In order to confirm the effect of the invention, the present inventors measured changes in the permittivity of the high dielectric layer by changing the amount of partially stabilized $ZrO_2$ stabilized with 5 to 15 mole % of $Y_2O_3$ based on the total amount of $ZrO_2$ in the above Example. The results are shown in FIG. 9.

In the above experiment, the shape of the electrode was adjusted to a dimension of 25 mm×25 mm×6 μm, and the thickness of the high dielectric layer was made 25 μm. Electrode layers composed of metallic Re and having a thickness of 5 μm were formed on both sides of the dielectric layer. The measurement was performed by using a Q meter (Y, H, P4342A) to obtain an electrostatic capacitance at 25° C. under a condition of 1 KHz and 1.0 Vrsm. From this electrostatic capacitance, a specific permittivity at 25° C. was calculated.

Figure 9:
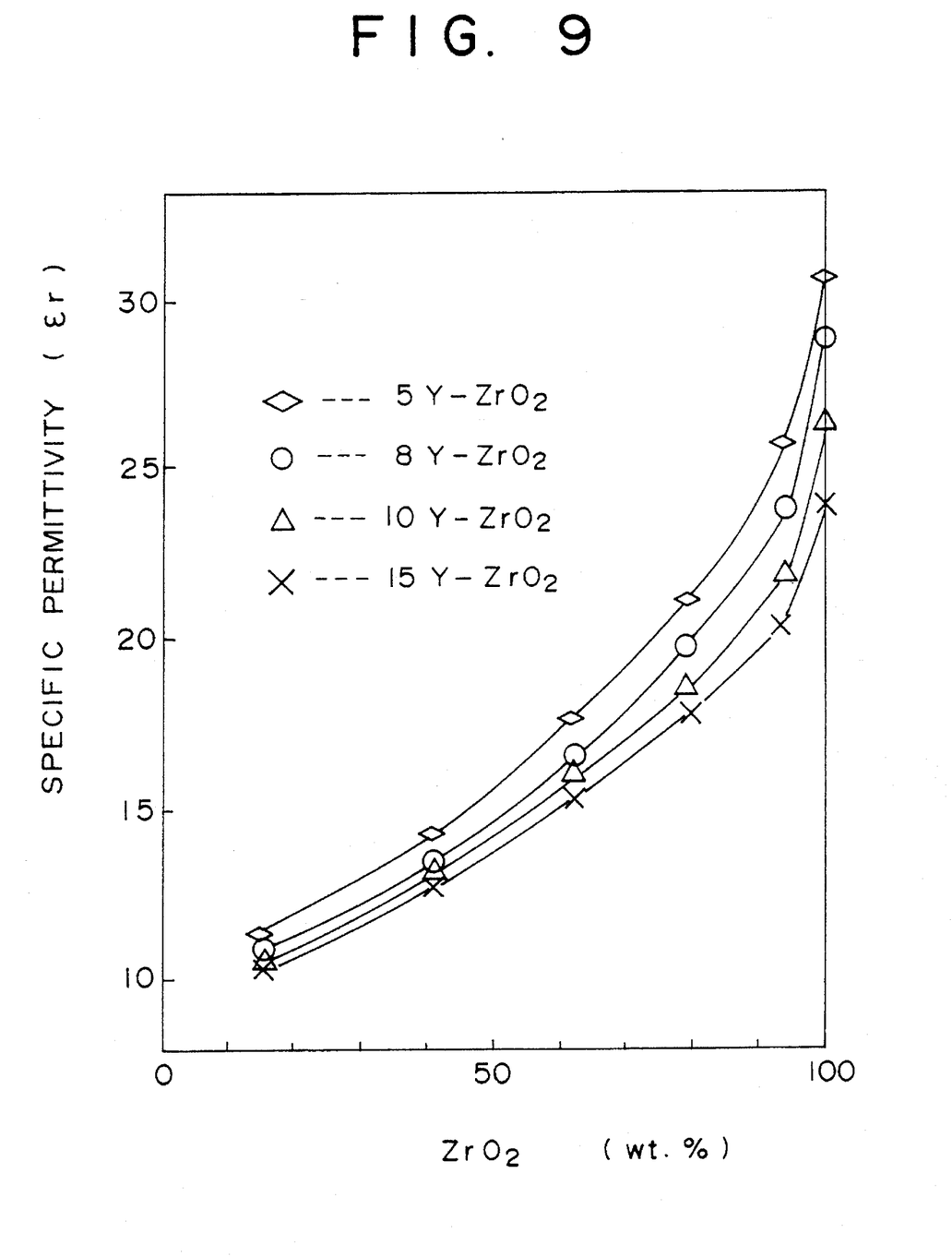
FIG. 9 s a graph showing the measured specific permittivity when the amount of $Y_2O_3$ as a stabilizer or the amount of $ZrO_2$ in the high dielectric layer was varied.

It is seen from the graph of FIG. 9 that when the amount added of partially stabilized $ZrO_2$ in the alumina increased, the permittivity became higher, and when the amount of $Y_2O_3$ dissolved in the entire amount of $ZrO_2$ was small, the specific permittivity was high.

EXAMPLE 6

Figure 10:
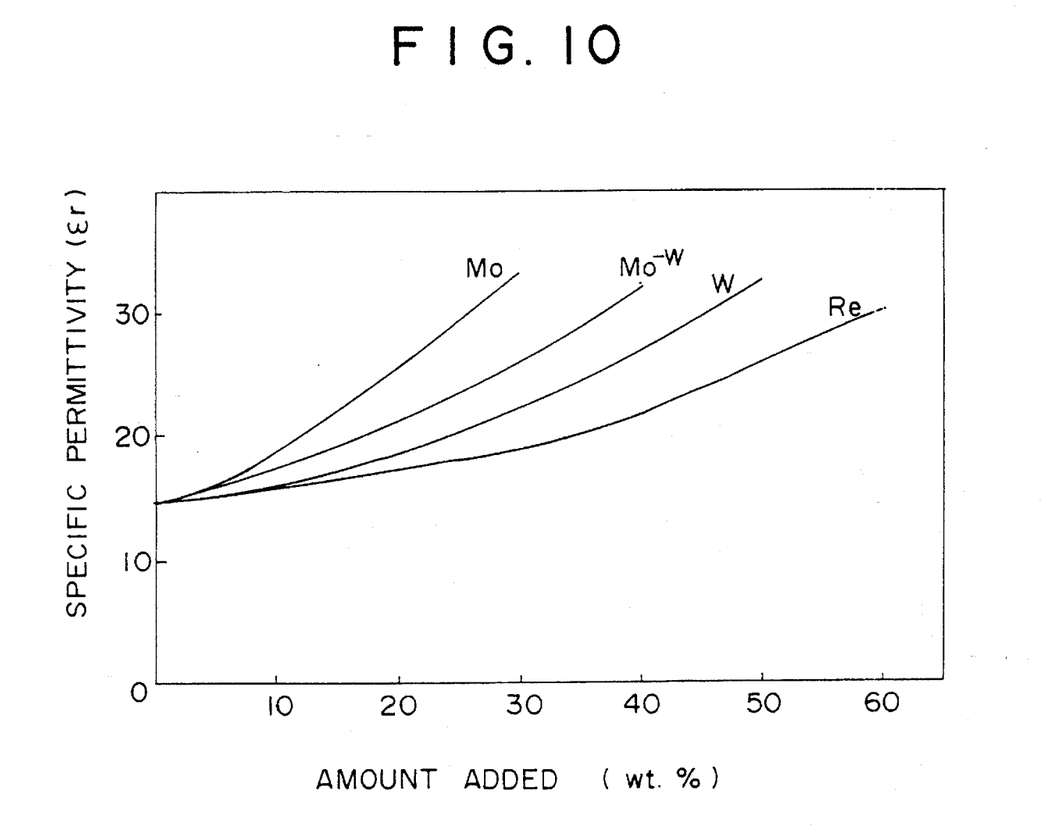
FIG. 10 is a graph showing specific permittivity measured by varying the amount of Mo, W, Re and Mo—W to be added to $Al_2O_3$—$ZrO_2$.

The present inventors further used 48% by weight of stabilized $ZrO_2$ stabilized with 8 mole % based on the entire amount of $ZrO_2$ of $Y_2O_3$, 48% by weight of $Al_2O_3$, and 4% by weight in total of 3% $SiO_2$, 0.5% CaO, 0.05% MgO as sintering aids, and further measured the specific permittivity of the material to which Mo, W or Re was added. The results are shown in FIG. 10. This graph of FIG. 10 showed that the material to which Mo, W or Re was added had an increased specific permittivity as compared with the case of not adding Mo, W or Re, and as the amount added of Mo, W, or Re increased, the specific permittivity increased. Furthermore, the present inventors performed an experiment in which the amount of Mo was increased to more than 30% by weight, an experiment in which the amount of W was added in an amount of more than 50% by weight, and an experiment in which the amount of Re was increased to more than 60% by weight. But it was found that when the amounts exceeded the above-mentioned amounts, the insulation resistance abruptly decreased and shorting occurred, and the specific permittivity could not be measured.

Furthermore, the present inventors performed an experiment in which in Example 5 Mo and W were added in a proportion of 1:1, and the results were shown in FIG. 10. From this FIG. 10, when Mo and W were added, the specific permittivity increased. The same effect can be obtained by adding Mo, W, and Re in the form of an oxide.

What is claimed is:

1. A multilayer alumina-based wiring substrate, comprising:

(i) a high dielectric layer defining sides, the high dielectric layer comprising:
alumina particles,
a high permittivity-imparting agent selected from a group consisting of (a) at least one of W and Mo, (b) Re and (c) zirconia, and
a grain boundary having a glass phase comprising alumina and at least one component selected from silica, an alkaline earth metal, and a rare earth element, (ii) a pair of electrode layers provided on the sides of the high dielectric layer, each of the electrode layers comprising at least one of W and Mo as a main component, and (iii) insulation layers comprising alumina particles and a glass phase comprising alumina and at least one component selected from silica, an alkaline earth metal and a rare earth element, the high dielectric layer and the electrode layers being disposed between the insulation layers.

2. The wiring substrate of claim 1, wherein the high dielectric layer comprises a sintered mixture comprising 67 to 87% by weight of an alumina powder, 5 to 30% by weight of at least one of a W powder and an Mo powder, and at least 3% by weight of at least one powder selected from silica, an alkaline earth metal and a rare earth element.

3. The wiring substrate of claim 1, wherein the high dielectric layer comprises a sintered mixture comprising 40 to 95% by weight of an alumina powder, 5 to 60% by weight of Re, and at least 3% by weight of at least one powder selected from silica, an alkaline earth metal and a rare earth element.

4. The wiring substrate of claim 1, wherein the high dielectric layer comprises a sintered mixture comprising 10 to 90% by weight of an alumina powder, 10 to 90% by weight of a zirconia powder, and at least one powder selected from silica, an alkaline earth metal and a rare earth element.

5. The wiring substrate of claim 1, wherein the high permittivity-imparting agent of the high dielectric layer comprises W and the electrode layers comprise W as a main component.

6. The wiring substrate of claim 1, wherein the high permittivity-imparting agent of the high dielectric layer comprises Mo and the electrode layers comprise Mo as a main component.

7. The wiring substrate of claim 1, wherein the high permittivity-imparting agent of the high dielectric layer comprises W, the electrode layer comprises Mo as a main component, and the dielectric layer has a thickness of at least 30 µm.

8. The wiring substrate of claim 1, wherein the high permittivity-imparting agent of the high dielectric layer comprises Mo, the electrode layer comprises W as a main component, and the dielectric layer has a thickness of at least 30 µm.

9. The wiring substrate of claim 1, wherein the high permittivity-imparting agent comprises ZrO2 and at least one of Mo, W and Re, wherein the Mo is present in an amount equal to 5 to 30% by weight based upon the total amount of the high dielectric layer, wherein the W is present in an amount equal to 5 to 50% by weight based upon the total amount of the high dielectric layer, and wherein the Re is present in an amount equal to 10 to 60% by weight based upon the total amount of the high dielectric layer.

10. The multilayer alumina-based wiring substrate of claim 1 further comprising a package for a semiconductor device in which the multilayer alumina-based wiring substrate is provided.

* * * * *